United States Patent [19]

Yada

[11] Patent Number: 4,559,521

[45] Date of Patent: Dec. 17, 1985

[54] CALIBRATION OF A MULTI-SLOPE A-D CONVERTER

[75] Inventor: Eiichi Yada, Gyoda, Japan

[73] Assignee: Takeda Riken Co., Ltd., Tokyo, Japan

[21] Appl. No.: 446,459

[22] Filed: Dec. 3, 1982

[30] Foreign Application Priority Data

Dec. 5, 1981 [JP] Japan ............................... 56-195973

[51] Int. Cl.[4] ............................................. H03K 13/02
[52] U.S. Cl. .......................... 340/347 NT; 324/99 D;
340/347 CC; 340/347 AD; 340/347 M
[58] Field of Search .... 340/347 NT, 347 M, 347 AD,
340/347 CC; 324/99 D, 78 D, 78 E, 74

[56] References Cited

U.S. PATENT DOCUMENTS

| 3,737,892 | 6/1973 | Dorey | 340/347 NT |
| 3,942,173 | 3/1976 | Wold | 340/347 M X |
| 4,354,176 | 10/1982 | Aihara | 340/347 M X |
| 4,395,701 | 7/1983 | Evans | 340/347 NT |

OTHER PUBLICATIONS

Walton, Triple Ramp Analog-To-Digital Converter.., IBM Technical Disclosure Bulletin vol. 11, No. 4, 9/1968, pp. 384–385.

Primary Examiner—T. J. Sloyan
Attorney, Agent, or Firm—Staas & Halsey

[57] ABSTRACT

A method for compensating for errors in reference current ratios in a multi-slope A-D converter allows determining multiplying factors for correcting the measured digital values of input analog signals that are being measured. The multiplying factors are determined using the components of the A-D converter.

9 Claims, 29 Drawing Figures

CALIBRATION OF A MULTI-SLOPE A-D CONVERTER

BACKGROUND OF THE INVENTION

This invention relates to calibration of an analog-to-digital converter, and especially to calibration of third and higher order integration periods of a multi-slope analog-to-digital (A-D) converter.

Figure 1:
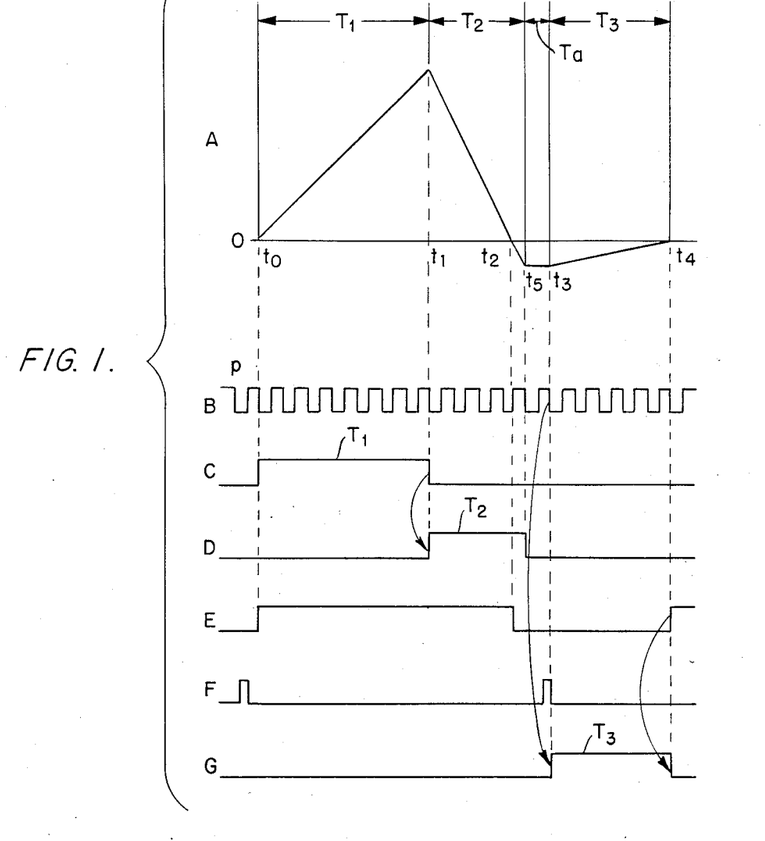

In A-D conversion, a multi-slope type A-D converter is frequently used for increasing conversion speed and resolution. A simple type of the multi-slope A-D converter is a triple slope type A-D converter. A voltage-to-time diagram of the triple slope A-D converter is shown in FIG. 1. During a first integration period $T_1$ an input analog signal is integrated, to generate a rising slope at the output of the integrator which begins at $t_0$ and ends at $t_1$.

At time $t_1$ a second integration period $T_2$ begins, and a first reference current of opposite polarity to the input signal is supplied to the integrator, so that the integrated signal begins to fall linearly at time $t_1$ as shown in FIG. 1A. When the integrated signal reaches a predetermined reference level at time $t_2$, in this case zero voltage, the supplying of the first reference current to the integrator is stopped in synchronism with the first falling edge of a clock signal after $t_2$, that is at time $t_5$.

After the second integration period $T_2$, a third integration period $T_3$ begins, during which a second reference current is integrated for improving conversion resolution. The second reference current has opposite polarity to the first reference current and also has a smaller magnitude than the first reference current. Thus during the third integration period $T_3$, the integrated signal has a rising slope at a relatively smaller angle as compared with that of the second integration period $T_2$. The third integration period $T_3$ ends at time $t_4$ when the integrated signal reaches the reference potential. By measuring the second integration period $T_2$ and the third integration period $T_3$ by counting clock signals provided during those periods, a digital signal corresponding to the input analog signal is obtained.

Since the second reference current may be selected smaller than the first reference current, for example by a factor of 1000, the slope of the third integration period may be made 1/1000th of the slope of the second integration period, and thus the resolution of the third integration period increases by 1000 times over that of the second integration period. Thus the A-D conversion resolution may be increased by employing a plurality of reference currents.

For converting an analog signal to a corresponding digital signal accurately in a multi-slope A-D converter, the first reference current should be adjusted correctly and it should be stable enough to maintain its accuracy for the period of measurement. Further, for achieving conversion accuracy, the ratios of the first, second, third, etc., reference currents should be correct and stable. A deviation from the correct ratio causes error when counting during the third or higher order integration periods because the digital data is calculated on the assumption that the ratios are correct.

In the prior art those ratios are adjusted manually, for example, by variable resistors in the reference current generators. Thus it is time consuming to adjust these ratios to be strictly correct. Also in prior art, for keeping those ratios within a high range of accuracy, it is necessary to use expensive parts and circuits.

SUMMARY OF THE INVENTION

It is an object of the present invention to provide a calibration method which is capable of compensating for errors caused by the incorrectness of the ratios of the reference currents.

It is another object of the present invention to provide a multi-slope A-D converter which is capable of calibrating itself automatically.

It is another object of the present invention to provide a multi-slope A-D converter which is capable of providing digital signals with high accuracy even if there exists errors in the ratios of the reference currents.

It is a further object of the present invention to provide a multi-slope A-D converter which is capable of A-D conversion with high accuracy while using inexpensive parts and circuits.

According to this invention, for calibrating the ratio of the first reference current to the second reference current, for example, at first the first reference current is integrated from ground potential for a predetermined fixed period, and after that the second reference current is integrated in the opposite direction until the integrated signal reaches ground potential. The time period during which the second reference current is integrated is measured by counting the clock pulses provided during this period. Since the actual value of the time period, during which the second reference current is integrated, is known, a multiplying factor may be obtained from the measured value and the actual value.

The multiplying factor thus obtained is used to calibrate the data measured during the third integration period of the A-D conversion process by multiplying the factor by the measured data. In the same manner, calibration for higher order integration periods may be achieved.

BRIEF DESCRIPTION OF THE DRAWINGS

FIGS. 1A–G show waveform illustrating the operation of a triple slope A-D converter of FIG. 2.

FIGS. 3A–B, D and G–E are waveforms illustrating the operation of acquiring the multiplying factor in the triple slope A-D converter of FIG. 2.

FIGS. 6A–E and G–H are waveforms illustrating the operation of a multi-slope A-D converter employing four integration periods.

FIGS. 7A, C–E and H–I are waveforms illustrating the operation of obtaining the calibrated multiplying factor in a multi-slope A-D converter operating according to the waveforms of FIGS. 6A–E and G–H.

DETAILED DESCRIPTION OF THE PREFERRED EMBODIMENTS

Figure 2:
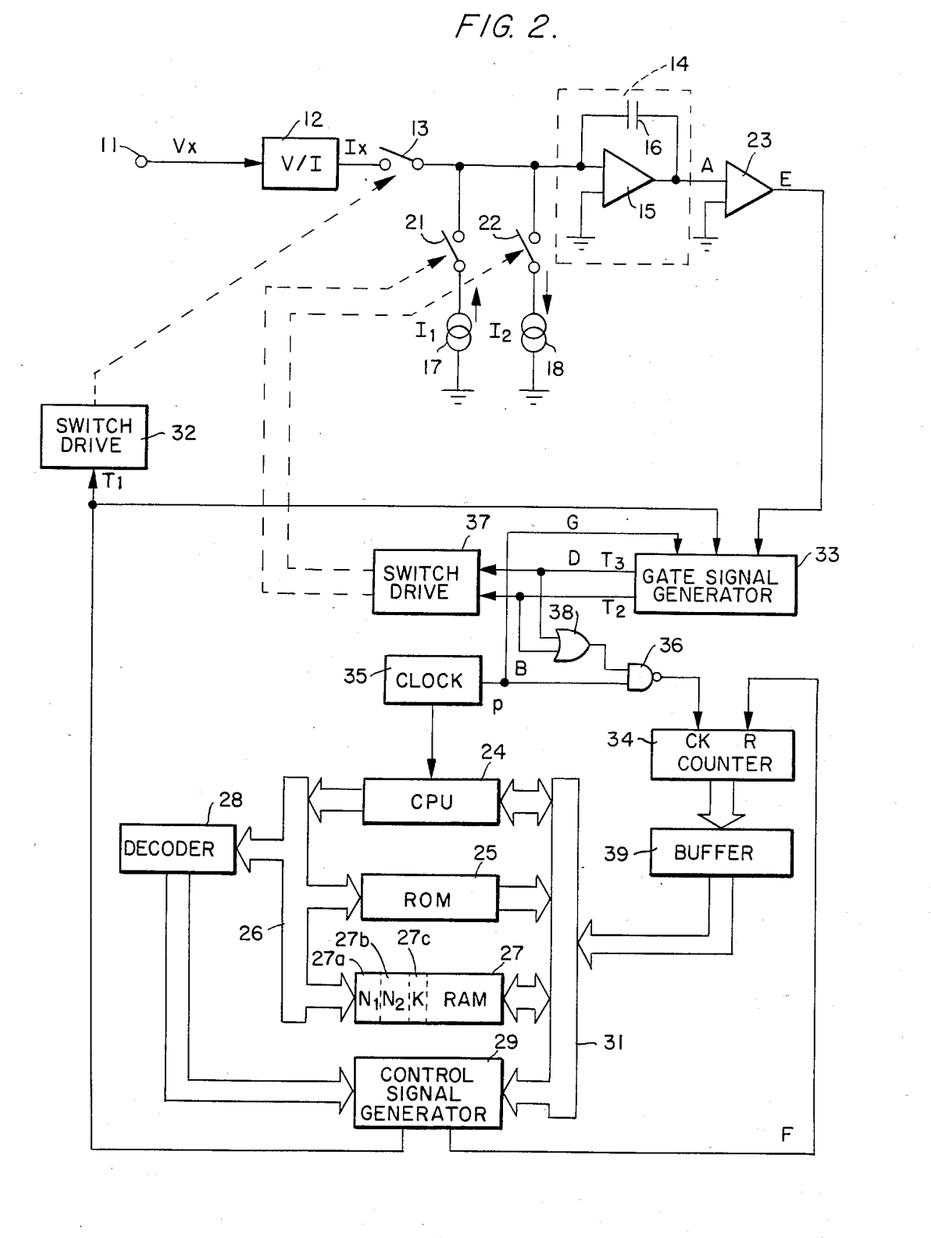
FIG. 2 is a block diagram of a triple slope A-D converter in accordance with a preferred embodiment of the invention.

FIG. 2 shows a preferred embodiment of the present invention. An input analog voltage $V_x$ is provided at an input terminal 11 and converted to a corresponding current $I_x$ by a voltage to current converter 12. The converted analog current $I_x$ is provided to an integrator 14 through a switch 13 which is controlled by a signal from a switch drive circuit 32. The integrator 14 is comprised, for example, of an operational amplifier 15 and an integrating capacitor 16 which is connected between an output and an inverting input of the operational amplifier 15.

The reference current sources 17,18 generate the reference currents $I_1$, $I_2$ which are selectively provided to the integrator 14 through switches 21, 22, respectively. The output signal from the capacitor 14 is compared with a predetermined reference level such as ground potential by a comparator 23. When the integrated output crosses the reference level, the comparator 23 changes its state for use in determining the end of each integration period. An output of the comparator 23 is connected to a gate signal generator 33 which generates gate signals $T_2$ and $T_3$ which gate a clock signal p. The gate signals $T_2$, $T_3$ are at high level during the second and third integration periods respectively and are supplied to a switch drive circuit 37 which controls the switches 21, 22 according to the gate signals $T_2$, $T_3$, respectively.

In this embodiment an A-D conversion and a calibration are operated according to a program previously stored in a program memory 25. A CPU 24 reads out the instructions of the program stored in the program memory 25 through an address bus 26, and in accordance with the instructions the CPU 24 controls the entire process of the operation of an A-D conversion including the calibration. The CPU 24 controls the writing and reading at random access memory 27 and provides address data to a decoder 28 through the address bus 26. In response to signals from the decoder 28, a control signal generator 29 generates control signals and provides them to the switch drive circuit 32, to the gate signal generator 33 to generate gate signals $T_2$ and $T_3$, and to the counter 34. The CPU 24 also executes all necessary calculations with data stored in the random access memory 27.

The output signal from the comparator 23 and clock pulses of the clock signal p from the clock signal generator 35 are provided to the gate signal generator 33. The clock signal generator 35 also provides the clock signal p to the CPU 24 and to a NAND gate 36. The gate signals $T_2$ and $T_3$ generated by the gate signal generator 33 are also supplied via an OR gate 38 to the NAND gate 36. Accordingly, during the second integration period $T_2$ and the third integration period $T_3$, the clock signal p is provided to the counter 34 whereby the number of clock pulses is the counted data stored in the random access memory 27 through a buffer 39 under the control of the CPU 24.

An A-D conversion procedure is performed as follows with reference to FIGS. 1 and 2. At time $t_0$ a control signal which indicates the first integration period $T_1$ as shown in FIG. 1C is generated by the control signal generator 29 and closes the switch 13 through the switch drive circuit 32. Accordingly, the input analog current $I_x$ is applied to the integrator 14 via the switch 13 at time $t_0$ and thus the integrated output signal begins rising linearly as illustrated in FIG. 1A.

At the end of the first integration period $T_1$ whose time period is fixed, that is at time $t_1$, the control signal of FIG. 1C is changed to low level so as to open the switch 13 and to disconnect the input analog current $I_x$ from the integrator 14.

Simultaneously, at time $t_1$ the switch 21 is closed by the gate signal shown in FIG. 1D so as to provide the first reference current $I_1$ to the integrator 14 and thus the second integration period $T_2$ is started. Accordingly, from the time $t_1$ the output from the integrator 14 goes down since the first reference current $I_1$ has the opposite polarity from that of the input analog current $I_x$.

The output of the comparator 23 is at high level until the integrated signal reaches the zero potential at time $t_2$, at which time the output of the comparator 24 changes to low level as in FIG. 1E. The gate signal of FIG. 1D is changed to low level by the first falling edge of a clock pulse following the changing of the state of the comparator 23. Thus, the switch 21 opens and the second integration period $T_2$ is finished at time $t_5$ by the change of the gate signal of FIG. 1D to low level.

During the second integration period $T_2$, the clock pulses provided through the NAND gate 36 are counted by the counter 34 and the counted data $N_1$ is stored in the random access memory 27. After the data is stored in the memory 27, a reset pulse shown in FIG. 1F generated by the control signal generator 29 resets the counter 34 for counting the clock pulses during the third integration period $T_3$.

In synchronism with the falling edge of the first clock pulse following the reset signal, the third integration $T_3$ begins, during which the switch 22 is closed and the second reference current $I_2$ is integrated by the integrator 14. Since the second reference current $I_2$ has the opposite polarity from that of the first reference current $I_1$ and is smaller in absolute magnitude than the first reference current $I_1$, the integrated signal increases slowly during the third integration period $T_3$.

The absolute magnitude of the second reference current $I_2$ is selected to be, for example, 1/1000th of the absolute magnitude of the first reference current $I_1$. Thus, during the third integration period $T_3$, the slope of the integrated signal is a thousand times less steep than that of the integrated signal of the second integration period $T_2$. Thus the number of clock pulses counted by the counter 34 during the third integration period is increased a thousand times over those counted within the second integration period, for the same voltage difference at the output of the integrator 14.

When the integrated signal reaches zero voltage the output of the comparator 23 changes from low level to high level and according to this change the gate signal of FIG. 1G is turned to low level, thus completing the third integration period. During the third integration period $T_3$ the clock pulses are counted by the counter 34 and the count value $N_2$ is stored in the random access memory 27.

From the stored data $N_1$ and $N_2$ the converted digital value of the input analog signal is obtained as being proportional to the sum $$N_1 - KN_2 \tag{1}$$

where K is a multiplying factor which indicates the ratio of the first and second reference currents $I_1$, $I_2$, in this case 1/1000. When the ratio of the actual reference currents $I_1$ to $I_2$ is different from a predetermined nominal value, an error is induced in the converted digital data if K is also not changed. To compute the exact digital value of the analog signal, it is necessary to measure one of the reference currents, for instance, the first reference current $I_1$ under the present formalism.

Figure 3:
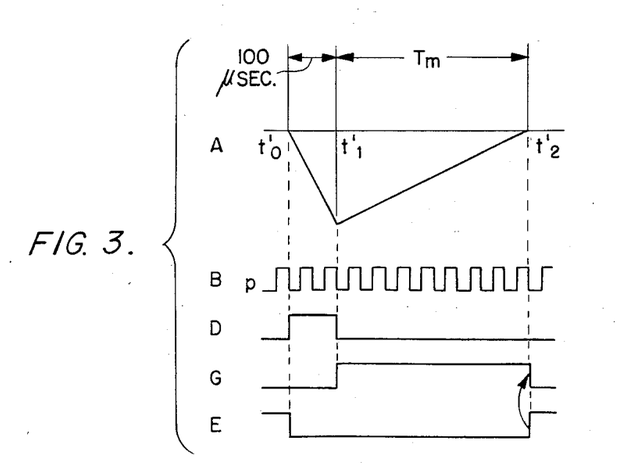
Figure 4:
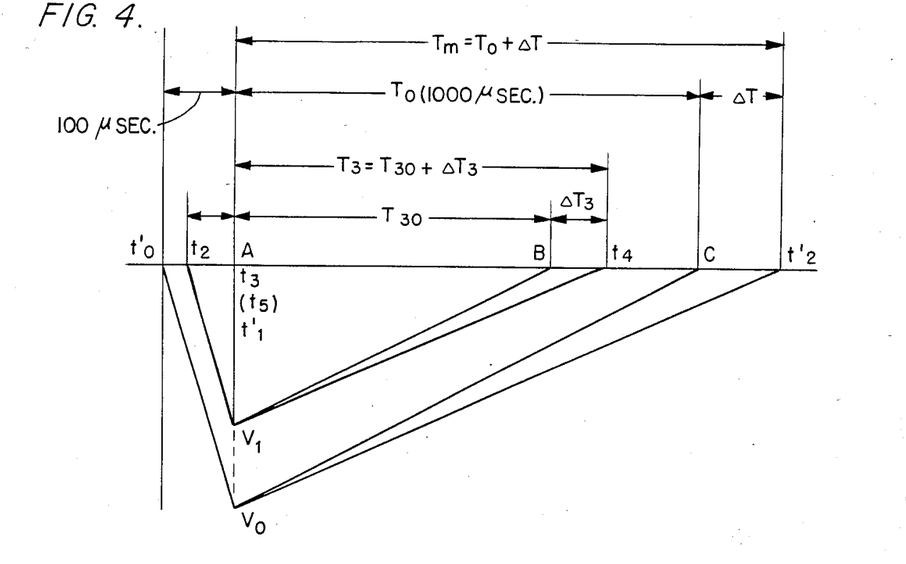
FIG. 4 shows waveforms for explaining the relation between the correct value and the measured value for the calibration process.
Figure 5:
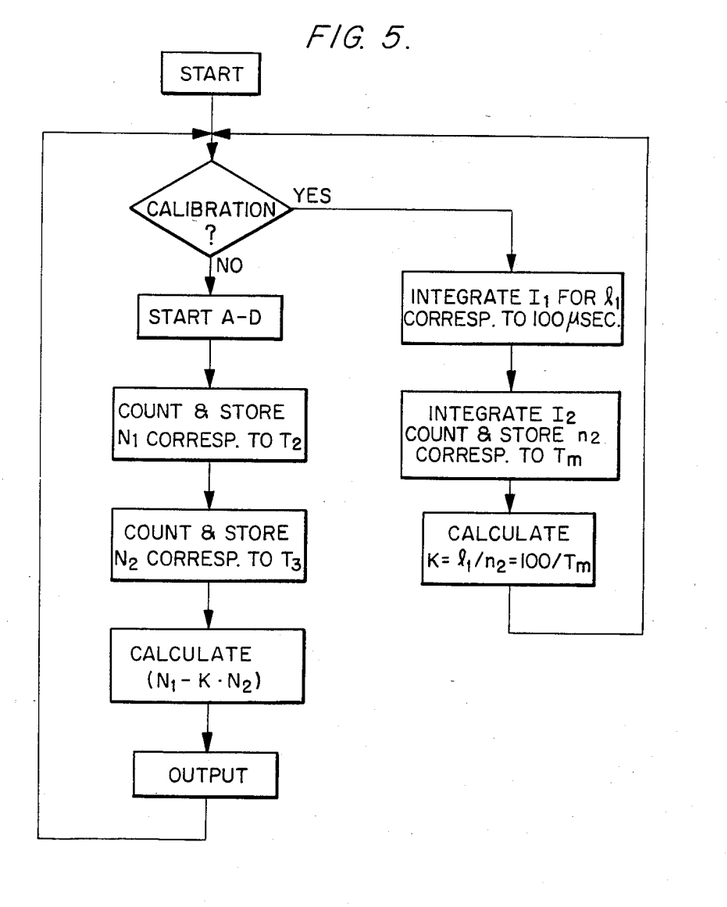
FIG. 5 is a flowchart of the operation of the A-D conversion process and the calibration process in the triple slope A-D converter of FIG. 2.

Thus, in this invention the factor K is calibrated by the calibration process described below. A calibration process according to this invention is performed periodically during the operation of A-D conversions, for example once in every hundred A-D conversions. Waveforms showing the operation of a calibration process are shown in FIGS. 3A–B, D–E and G and 4. A flowchart of the operation of an A-D conversion process and a calibration process as performed in this embodiment is illustrated in FIG. 5.

At the beginning of the calibration, that is at time $t_0'$, the switch 21 is turned ON by the gate signal shown in FIG. 3D, in synchronism with a clock pulse, and the first reference current $I_1$ is provided to the integrator 14. Thus, the integrated signal falls linearly from zero voltage as shown in FIG. 3A.

This integration period is fixed, for example at 100 microseconds corresponding to a certain number of counts of the clock signal say $l_1$, and at the end of the period, that is at time $t_1$, the switch 21 is turned OFF and the switch 22 is turned ON instead so as to provide the reference $I_2$ to the integrator 14. Thus, the output from the integrator 14 begins to rise at time $t_1'$ and continues to rise until it crosses the reference potential, thus defining the measured period $T_m$, having a corresponding number of counts, say $n_2$. When the output from the integrator 14 crosses zero voltage at time $t_2'$, the output of the comparator 23 changes to high level so that the switch 22 is opened by the gate signal of FIG. 3G. During this measured period $T_m$ the clock pulses are counted by the counter 34 and the counted data is stored in the memory 27.

The frequency of the clock signal p may for instance be 1 MHz, the period of time during which the first reference current $I_1$ is integrated may be 100 microseconds, and the nominal ratio of the first reference current $I_1$ to the second reference current $I_2$ may ideally be 1000 to 1. If the actual ratio of the reference currents $I_1$ to $I_2$ is exactly 1000, the number $n_2$ of counted clock pulses during the period $T_m$ will therefore be 100,000. When the ratio of $I_1$ to $I_2$ is different from 1000, the count during period $T_m$ also varies from 100,000, so that an error $\Delta T$ arises in the measued period $T_m$. Thus the measured period $T_m$ is the sum of a correct value $T_0$ and the error $\Delta T$, $T_m = T_0 + \Delta T$.

Since the measured time period $T_m$ is inversely proportional to the second reference curent $I_2$, the calibrated multiplying factor K is obtained by the following equation.

$$K = \frac{100}{T_m} = \frac{100}{T_0 + \Delta T} = \frac{1}{1000} \times \frac{1}{\left(1 + \frac{\Delta T}{T_0}\right)} \quad (2)$$

Namely, the factor K thus obtained is the actual ratio of the counts $l_1/n_2$ during the calibration, or of the reference currents $I_1$ to $I_2$, and when the error $\Delta T$ is zero the multiplying factor K is exactly 1/1000. The calibrated multiplying factor K is stored in the memory 27 and is used in the A-D conversion process for compensating the data $N_2$, obtained during the third integration period of the conversion operation, by multiplying the data $N_2$ by the factor K.

More details of the relation between the calibration process and the second and third integration periods $T_2$, $T_3$ of the A-D conversion process are illustrated in FIG. 4. Namely, the second integration period $T_2$ ($t_2$ to $t_3$) and the third integration period $T_3$ ($t_3$ to $t_4$) of the A-D conversion process shown in FIG. 1, are superimposed on the fixed period ($t_0'$ to $t_1'$) and the period $t_m$ ($t_1'$ to $t_2'$) of the calibration process for convenience of explanation. Also the period $T_a$ shown in FIG. 1 is excluded for simplicity.

In the A-D conversion process, the first reference current $I_1$ is integrated during the time interval from $t_2$ to $t_5$ so that the integrated signal becomes $V_1$ at time $t_5$ and after that the second reference current $I_2$ is integrated during the time interval from $t_3$ to $t_4$. If a difference from the correct value exists in the ratio of the first reference current $I_1$ to the second reference current $I_2$, there exists an error in the measured value of the third integration period $T_3$. Thus, the measured period of time $T_3$, that is the data $N_2$ of the equation (1), is the sum of a correct period of time $T_{30}$ and the error $\Delta T_3$, namely $T_3 = T_{30} + \Delta T_3$.

In the calibration process, the first reference current $I_1$ is integrated during the fixed period from $t_0'$ to $t_1'$, so that the integrated signal becomes $V_0$ at time $t_1'$ and after that the period $T_m$ starts.

Since the same reference currents $I_1$ and $I_2$ are integrated both in the A-D conversion process and in the calibration process, the line $\overline{t_0'V_0}$ and the line $\overline{t_2V_1}$ are parallel to each other, the line $\overline{V_0t_2'}$ is parallel to the line $\overline{V_1t_4}$, and the line $\overline{V_0C}$ is parallel to the line $\overline{V_1B}$. Thus, the ratios $\Delta T/T_0$ and $\Delta T_3/T_{30}$ have equal values. By multiplying the calibrated multiplying factor K acquired from the equation (2) by the measured period of time $T_3$ for obtaining $KN_2$ of equation (1), $$K(T_{30} + \Delta T_3) = \frac{T_{30}}{1000} \times \frac{\left(1 + \frac{\Delta T_3}{T_{30}}\right)}{\left(1 + \frac{\Delta T}{T_0}\right)} = \frac{T_{30}}{1000}, \quad (3)$$

Thus regardless of the error $\Delta T_3$, the correct value of third integration period $T_{30}$ is obtained.

In the same way as the procedure described above for a triple-slope A-D converter, this invention is applicable to a multi-slope A-D converter employing a higher order integration.

Figure 6:
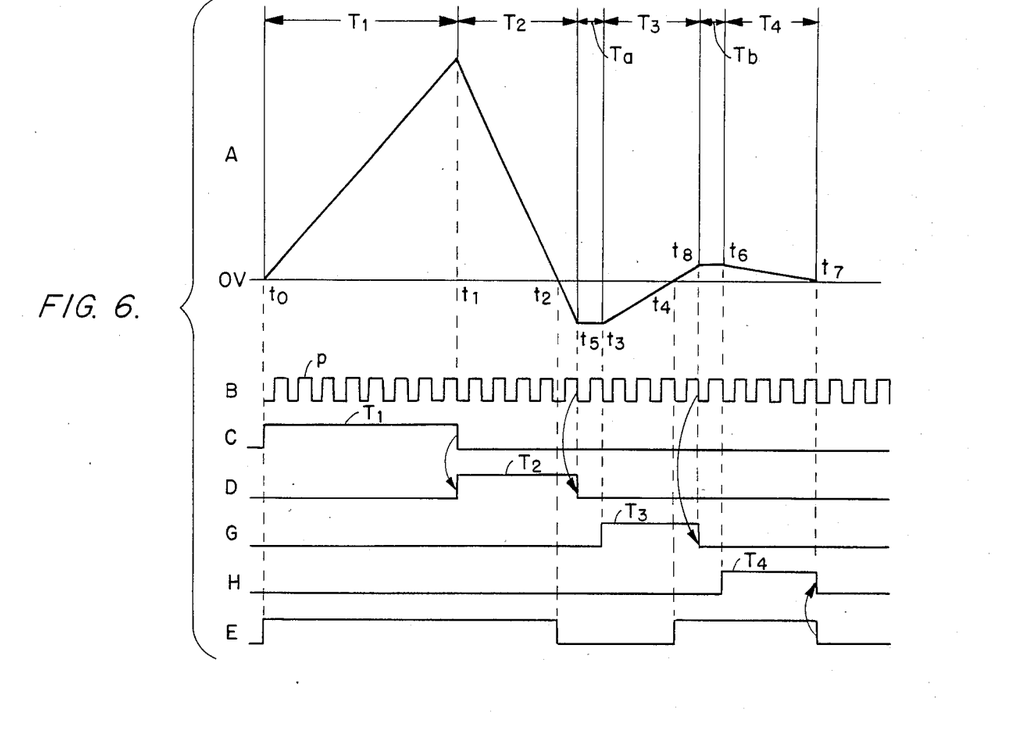

FIG. 6 shows a waveform illustrating the operation of a multi-slope A-D converter employing four integrating slopes. In this embodiment a third reference current $I_3$ which has the opposite polarity of $I_2$ is provided to be integrated during the fourth integration period $T_4$. According to a gate signal shown in FIG. 6H, the fourth integration period $T_4$ starts at time $t_6$ and the integration of the third reference current $I_3$ accumulates in the opposite direction than the direction of third integration period $T_3$. The third reference current $I_3$ is selected to be smaller in magnitude than the second reference current $I_2$ for increasing conversion resolution.

The pulses of the clock signal p are counted by the counter 34 during the fourth integration period $T_4$ and the count value $N_3$ is stored in the memory 27. The A-D converted digital value of the input analog signal is obtained as being proportional to the sum $$N_1 - K_1 N_2 + K_1 K_2 N_3 \qquad (4)$$

wherein $K_1$ and $K_2$ are multiplying factors, that is, $K_1 = I_2/I_1 = l_1/n_2$ and $K_2 = I_3/I_2 = l_2/n_3$, in which $n_i$ is the respective number of counts for the ith reference current during the count period $T_m$ for each calibration of the two current sources $I_2$ and $I_3$ in terms of $I_1$ and $I_2$, respectively, as described above for $I_1$ and $I_2$ in connection with equations (1) to (3) above, and $l_1$ and $l_2$ are the respective fixed numbers of counts for the respective calibrations, both of which may typically be taken to be 100 microsec, for example. This result can be generalized to the case of an $(m+1)-$ slope A-D converter having m reference currents, for which the digital value of the analog signal is proportional to $$N_1 - K_1 N_2 + \ldots + (-1)^{m-1} K_o K_1 \ldots K_{m-1} N_m = \qquad (4)$$

$$\sum_{j=1}^{m} (-1)^{j-1} K_o \ldots K_{j-1} N_j$$

wherein $K_o = 1$ and $K_j = l_{j-1}/n_h = I_j/I_{j-1}$ is the multiplying factor for the jth reference current. Of course, the coefficient of each count value $N_i$ is a respective function of the multiplying factors $K_1$ to $K_{m-1}$, with the coefficient of $N_1$ being unity.

Figure 7:
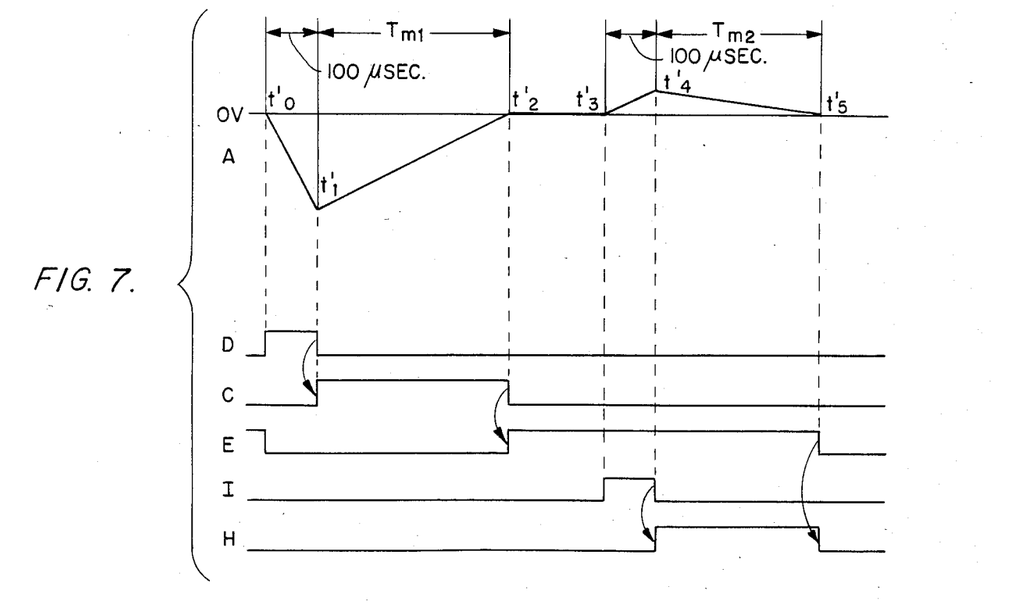
Figure 8:
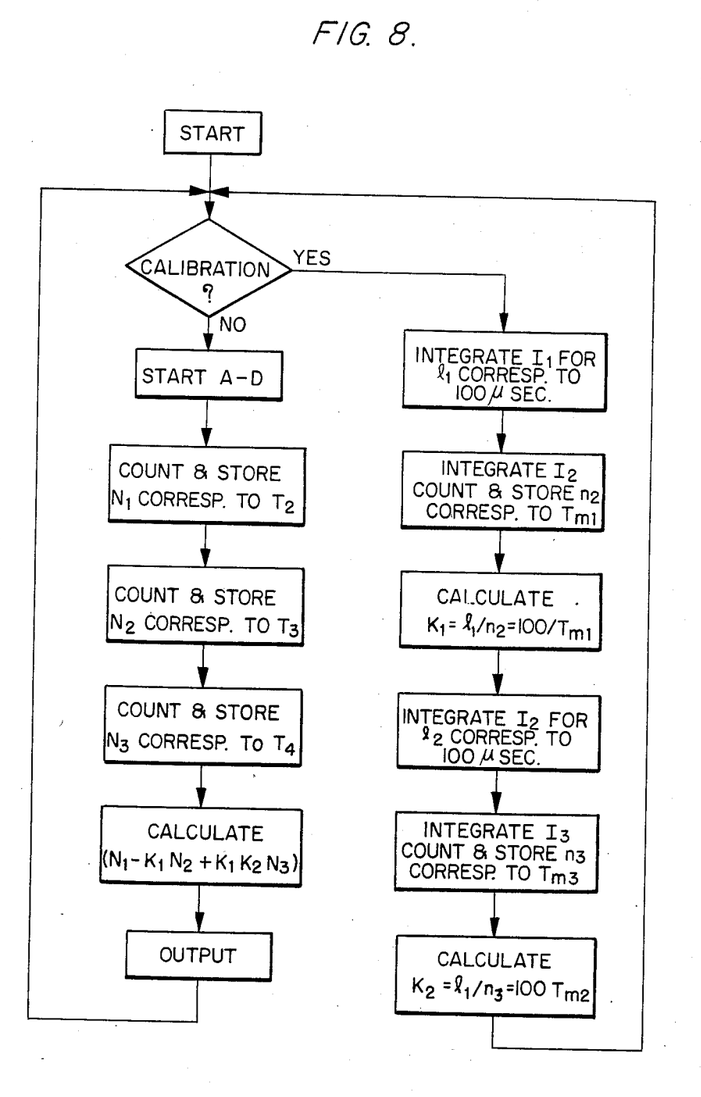
FIG. 8 is a flowchart of the operation of an A-D conversion process and a calibration process as performed in a multi-slope A-D converter operating according to the waveforms of FIGS. 6A–E and G–H.

FIGS. 7A, C-E and H-I are waveforms illustrating the operation of obtaining the calibrated multiplying factors $K_1$ and $K_2$ in the multi-slope A-D converter employing four integrating slopes. FIG. 8 shows a flowchart of the operation of the A-D conversion process and of the calibration process performed in the multi-slope A-D converter of FIG. 6. For a fixed time period of for instance 100 microsec, from time $t_0'$ to $t_1'$, the first reference current $I_1$ is integrated and after the time $t_1'$ the second reference current $I_2$ is integrated until the integrated signal reaches ground potential. This period of time $T_{m1}$ (from $t_1'$ to $t_2'$) is measured by the counter 34 counting the clock pulses p. The calibrated multiplying factor $K_1$ is then acquired by calculating $100/T_{m1}$ or the ratio of the respective counts.

Then, during a subsequent fixed time period of for instance 100 microsec also, that is from $t_3'$ to $t_4'$, the second reference current $I_2$ is integrated, and after the time $t_4'$ the third reference current $I_3$ is integrated until the integrated signal reaches ground potential. This time period $T_{m2}$ (from $t_4'$ to $t_5'$) is measured by the counter counting the clock pulses of the clock signal p. The calibrated multiplying factor $K_2$ is then obtained by calculating $100/T_{m2}$. Accordingly the desired digital value of the input analog signal can be provided.

Many variations and modifications of the present invention will be obvious to a skilled worker in view of the present disclosure. For instance, reference voltages other than ground potential could be utilized to trigger the ending of each integration period for integrating reference, so that the successive reference currents would not have to have alternating polarities. Also the counting of clock pulses during different integration periods can involve halting the counting on crossing different reference voltage levels, as long as the difference in voltage between such different voltage levels is known. Also, it is possible to integrate other than the first (largest absolute magnitude reference current), and for different periods of time, when determining the ratios of counts for the ratios of currents. Thus, the calibration also results with appropriate modification if $I_1$ is integrated for the predetermined 100 microseconds, followed by counting the pulses while integrating $I_3$ to bring the integration signal to some reference voltage, although some polarity inversion is needed in the case of alternating polarities in the reference currents.

I claim:

1. A method for calibrating the $m-1$ multiplying factors of the count values of m integrations of m respective reference currents $I_1, I_2 \ldots I_m$ in a multi-slope A-D converter for converting an input analog signal to a digital value proportional thereto, said A-D converter including current sources for said reference currents, an integrator, switches for switching said input analog signal and reference currents to said integrator, a clock for providing clock signals to be counted and for timing said switching, a counter and computing and storage means, said reference currents being ordered by decreasing absolute magnitude and having alternating polarities, with the first reference current having the opposite polarity than said input analog signal, said multiplying factors being for compensating for error in said digital value caused by the $m-1$ ratios of the reference currents varying from their nominal values, wherein the components of the A-D converter are utilized for the calibration, said method comprising operating said switches and said counter for integrating the first reference current for a period of time corresponding to an integer number $l_1$ of said clock pulses, the integration beginning from a first reference level, operating said switches and said counter for integrating the next reference current for a number $n_2$ of said clock pulses that is determined by the return of the output of the integrator to said first reference level, repeating the two steps above as to each successive pair of said reference currents, starting with the second and third reference currents as the first successive pair after the first and second reference currents to yield respective count values $l_2$ and $n_3$, utilizing said calulating and storing means for forming the multiplying factor for each said successive pair of said ordered reference currents to be $K_1 = l_1/n_2 = I_2/I_1$, $K_2 = l_2/n_3 = I_3/I_2$, . . . $K_{m-1} = l_{m-1}/n_m = I_m/I_{m-1}$, wherein said A-D converter provides the digital value of said input analog signal as being proportional to the respective sum of $$\sum_{j=1}^{m} (-1)^{j-1} K_o \ldots K_{j-1} N_j$$

where $K_o = 1$, $m = \geq 2$ and $N_j$ is the number of clock pulses counted in the jth integration period for the jth reference current for the A-D conversion of the respective input analog signal, each said integration period for the A-D conversion involving integrating the respective reference current for an integer number of clock pulses until a predetermined clock pulse after the integrated signal crosses said reference level.

2. The method of claim 1, comprising, during the calibration of the multiplying factor of at least the last successive pair of said reference currents, $K_{m-1}$, the number of the clock pulses $n_m$ for the integrating of the last (mth) one of said reference currents is determined by the crossing by the integrated signal of said first reference current.

3. The method of claim 1, said A-D converter comprising a triple-slope converter having two of said reference currents, said multiplying factors consisting of $K_1 = l_1/n_2 = I_2/I_1$ and $K_2 = l_2/n_3 = I_3/I_2$, whereby the digital value of said input analog signal is provided as proportional to $N_1 - K_1 N_2$.

4. The method of claim 1, said converter comprising a four-slope A-D converter having three of said reference currents, said multiplying factors consisting of $K_1 = l_1/n_2 = I_2/I_1$ and, $K_2 = l_2/n_3 = I_3/I_2$, whereby the digital value of said input analog signal is provided as proportional to $N_1 - K_1 N_2 + K_1 K_2 N_3$.

5. The method of claim 2, wherein the nominal value of $I_2/I_1 = 1/1000$.

6. The method of claim 3, wherein the nominal value of $I_2/I_1 = 1/1000$.

7. The method of claim 4 wherein each respective count value in the numerator of each term defining a respective multiplying factor corresponds to 100 microsec.

8. A method for calibrating the $m-1$ multiplying factors $a_1, \ldots a_{m-1}$ of the count values of m integrations of m respective reference currents $I_1, I_2 \ldots I_m$ in a multi-slope A-D converter for converting an input analog signal to a digital value proportional thereto, said A-D converter including current sources for said reference currents, an integrator, switches for switching said input analog signal and reference currents to said integrator, a clock for providing clock signals to be counted and for timing said switching, a counter and computing and storage means, said reference currents being ordered by decreasing absolute magnitude and having alternating polarities, with the first reference current having the opposite polarity than said input analog signal the calibrating of, said multiplying factors being for compensating for error in said digital value caused by the $m-1$ ratios of selected pairs of the reference currents varying from their nominal values, wherein the components of the A-D converter are utilized for the calibration, said method comprising operating said switches and said counter for integrating a first selected reference current for a period of time corresponding to an integer number $l_1$ of said clock pulses, the integration beginning from a first reference level, operating said switches and said counter for integrating a second selected reference current having an absolute magnitude smaller than said first selected reference current and a polarity opposite to that of said first selected reference current for a number $n_2$ of said clock pulses that is determined by the return of the output of the integrator to said first reference level, repeating the two steps above as to $m-2$ selected pairs of said reference currents, each said pair including one of the reference currents that was not previously selected, utilizing said calculating and storing means for forming a respective factor for each said pair of selected reference currents as the ratio of $l_1 n_2$, etc, and for forming said multiplying factors as respective functions of said ratios, wherein said A-D converter provides the digital value of said input analog signal as being proportional to the respective sum of $$\sum_{j=1}^{m} a_{j-1} N_j$$

wherein $a_0 = 1$ and $m \geq 2$, and $N_j$ is the number of clock pulses counted in the jth integration period for the jth reference current for the A-D conversion of the respective input analog signal, each said integration period for the A-D conversion involving integrating the respective reference current for an integer number of clock pulses until a predetermined clock pulse after the integrated signal crosses said reference level.

9. The method of claim 8, wherein each said multiplying factor $a_i$ is given by the product $$(-1)^i \prod_{r=0}^{r=i} K_0 \ldots K_r$$

wherein each $K_r$ is the ratio of the respective count values $1_r/n_{r+1}$ for the respective pairs of said reference currents and $K_0 = 1$.

* * * * *

UNITED STATES PATENT AND TRADEMARK OFFICE
CERTIFICATE OF CORRECTION

PATENT NO. : 4,559,521

DATED : 17 Dec. 1985

INVENTOR(S) : Yada

It is certified that error appears in the above-identified patent and that said Letters Patent is hereby corrected as shown below:

Col. 3, line 32, after "according" insert --to--.

Col. 8, line 43, "calulating" should be --calculating--;

line 56, "m = $\geqq$ 2" should be --m $\geqq$ 2--.

Col. 9, line 38, "of," should be --of--.

Col. 10, line 11, after "m-2" insert --further--.

Signed and Sealed this

Sixth Day of May 1986

[SEAL]

Attest:

Attesting Officer

DONALD J. QUIGG

Commissioner of Patents and Trademarks